(12) United States Patent
Liu et al.

(10) Patent No.: US 7,416,989 B1
(45) Date of Patent: Aug. 26, 2008

(54) ADSORPTION BASED MATERIAL REMOVAL PROCESS

(75) Inventors: Xinye Liu, Sunnyvale, CA (US); Joshua Collins, Sunnyvale, CA (US); Kaihan A. Ashtiani, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/479,812

(22) Filed: Jun. 30, 2006

(51) Int. Cl.
*H01L 21/302* (2006.01)

(52) U.S. Cl. ........................... 438/706; 438/745

(58) Field of Classification Search ............... 438/706, 438/710, 714, 723, 724, 726, 745, 725
See application file for complete search history.

(56) References Cited

U.S. PATENT DOCUMENTS

| | | | |
|---|---|---|---|
| 4,695,327 A * | 9/1987 | Grebinski | 134/11 |
| 4,756,794 A | 7/1988 | Yoder | |
| 5,030,319 A | 7/1991 | Nishino et al. | |
| 5,268,069 A * | 12/1993 | Chapple-Sokol et al. | 216/73 |
| 5,282,925 A | 2/1994 | Jeng et al. | |
| 5,474,641 A | 12/1995 | Otsuki et al. | |
| 5,505,816 A | 4/1996 | Barnes et al. | |
| 5,636,320 A | 6/1997 | Yu et al. | |
| 5,766,971 A | 6/1998 | Ahlgren et al. | |
| 5,792,275 A | 8/1998 | Natzle et al. | |
| 5,838,055 A | 11/1998 | Kleinhenz et al. | |
| 5,876,879 A | 3/1999 | Kleinhenz et al. | |
| 5,968,279 A | 10/1999 | Macleish et al. | |
| 5,976,973 A * | 11/1999 | Ohira et al. | 438/645 |
| 5,994,240 A | 11/1999 | Thakur | |
| 6,071,815 A | 6/2000 | Kleinhenz et al. | |
| 6,074,951 A | 6/2000 | Kleinhenz et al. | |
| 6,335,261 B1 | 1/2002 | Natzle et al. | |
| 6,573,181 B1 | 6/2003 | Srinivas et al. | |
| 6,652,713 B2 | 11/2003 | Brown et al. | |
| 6,706,334 B1 | 3/2004 | Kobayashi et al. | |
| 6,726,805 B2 | 4/2004 | Brown et al. | |
| 6,776,874 B2 | 8/2004 | Kobayashi et al. | |
| 6,790,733 B1 | 9/2004 | Natzle et al. | |
| 6,803,309 B2 | 10/2004 | Chou et al. | |

(Continued)

FOREIGN PATENT DOCUMENTS

WO   04/001809   12/2003

OTHER PUBLICATIONS

T. Meguro et al., "Digital etching of GaAs: New approach of dry etching to atomic ordered processing", Apr. 16, 1990, American Institute of Physics pp. 1552-1554.

(Continued)

*Primary Examiner*—Kin-Chan Chen
(74) *Attorney, Agent, or Firm*—Weaver Austin Villeneuve & Sampson LLP

(57) ABSTRACT

Methods for accurate and conformal removal of atomic layers of materials make use of the self-limiting nature of adsorption of at least one reactant on the substrate surface. In certain embodiments, a first reactant is introduced to the substrate in step (a) and is adsorbed on the substrate surface until the surface is partially or fully saturated. A second reactant is then added in step (b), reacting with the adsorbed layer of the first reactant to form an etchant. The amount of an etchant, and, consequently, the amount of etched material is limited by the amount of adsorbed first reactant. By repeating steps (a) and (b), controlled atomic-scale etching of material is achieved. These methods may be used in interconnect pre-clean applications, gate dielectric processing, manufacturing of memory devices, or any other applications where removal of one or multiple atomic layers of material is desired.

30 Claims, 10 Drawing Sheets

U.S. PATENT DOCUMENTS

| | | | |
|---|---|---|---|
| 6,817,776 | B2 | 11/2004 | Colgan et al. |
| 6,837,968 | B2 | 1/2005 | Brown et al. |
| 6,852,584 | B1 | 2/2005 | Chen et al. |
| 6,858,532 | B2 | 2/2005 | Natzle et al. |
| 6,905,965 | B2 | 6/2005 | Subrah et al. |
| 6,926,843 | B2 | 8/2005 | Cantell et al. |
| 6,951,821 | B2 | 10/2005 | Hamelin et al. |
| 6,967,167 | B2 | 11/2005 | Geiss et al. |
| 6,992,011 | B2 | 1/2006 | Nemoto et al. |
| 7,029,536 | B2 | 4/2006 | Hamelin et al. |
| 7,079,760 | B2 | 7/2006 | Hamelin et al. |
| 2001/0016226 | A1* | 8/2001 | Natzle et al. ............ 427/79 |
| 2002/0106908 | A1 | 8/2002 | Cohen et al. |
| 2003/0029568 | A1 | 2/2003 | Brown et al. |
| 2003/0134038 | A1* | 7/2003 | Paranjpe ............ 427/248.1 |
| 2004/0018740 | A1 | 1/2004 | Brown et al. |
| 2004/0083977 | A1 | 5/2004 | Brown et al. |
| 2004/0182324 | A1 | 9/2004 | Wallace et al. |
| 2004/0184792 | A1 | 9/2004 | Hamelin et al. |
| 2004/0185670 | A1 | 9/2004 | Hamelin et al. |
| 2004/0200244 | A1 | 10/2004 | Hung et al. |
| 2005/0056370 | A1 | 3/2005 | Brown et al. |
| 2005/0101130 | A1 | 5/2005 | Lopatin et al. |
| 2005/0106877 | A1* | 5/2005 | Elers et al. ............ 438/689 |
| 2005/0205110 | A1 | 9/2005 | Kao et al. |
| 2005/0218113 | A1 | 10/2005 | Yue |
| 2005/0218507 | A1 | 10/2005 | Kao et al. |
| 2005/0221552 | A1 | 10/2005 | Kao et al. |
| 2005/0230350 | A1 | 10/2005 | Kao et al. |
| 2005/0266684 | A1 | 12/2005 | Lee et al. |
| 2005/0270895 | A1 | 12/2005 | Strang |
| 2006/0051966 | A1 | 3/2006 | Or et al. |

OTHER PUBLICATIONS

S.D. Park et al. "Atomic Layer Etching of Si(100) and Si(111) Using $Cl_2$ and Ar Neutral Beam", Electrochemical and Solid-State Letters, 8(8) C106-C109 (2005).

H. Ogawa et al., "Dry Cleaning Technology for Removal of Silicon Native Oxide Employing Hot $NH_3/NF_3$ Exposure", The Japan Society of Applied Physics, Part I, No. 8, Aug. 2002, pp. 5349-5358.

H. Nishino et al., "Damage-free selective etching of Si native oxides using $NH_3/NF_3$ and $SF_6/H_2O$ down-flow etching", J. Appl. Phys. vol. 74, No. 2, Jul. 15, 1993, pp. 1345-1348.

Y. Yang et al., "Ultrahigh-selectivity silicon nitride etch process using an inductively coupled plasma source", J. Vac. Sci. Technol. A, vol. 16, No. 3, May/Jun. 1998, pp. 1582-1587.

Phan et al., Integrated Clean Process Using $NF_3/NH_3$ Remote Plasma for Nickle Silicide Formation, SEMICON Korea STS 2006, pp. 159-163.

S. Athavale et al., Molecular dynamics simulation of atomic layer etching of silicon, J. Vac. Sci. Technol. A, vol. 13, No. 3, May/Jun. 1995, pp. 966-971.

W. Natzle et al., "Trimming of hard-masks by Gaseous Chemical Oxide Removal (COR) for Sub-10nm Gates/Fins, for Gate Length Control and for Embedded Logic", 2004 IEEE/SEMI Advanced Semiconductor Manufacturing Conference, pp. 61-65.

Liu et al., "Modulating Etch Selectivity and Etch Rate of Silicon Nitride Thin Films," Novellus Systems, Inc., U.S. Appl. No. 12/002,085, filed Dec. 13, 2007.

Honda et al., "Chemical Dry Cleaning Technology for Reliable 65nm CMOS contact to $NiSi_x$,", IITC-2005 paper9.4.

Okamura et al., "Low Damage Via Formation with Low Resistance by NH3 Thermal Reduction for Cu / Ultra Low-k Interconnects", 2004 IEEE, pp. 42-44.

Kim, et al., "New Contact Cleaning in NF & N2/H2 Microwave Plasma", Solid State Phenomena vol. 92, (2003), pp. 239-242.

Byun et al., The Effects of Reactive Precleaning (RPC+) on the Formation of Titanium Silicide By PECVD $TiCl_4$-Ti Deposition, and Its Thermal Stability, 2001, IEEE, pp. 222-224.

Taguwa, et al., "ICP-Ar/$H_2$ Precleaning and Plasma Damage-Free Ti-PECVD for Sub-Quarter Micron Contact of Logic with Embedded DRAM", Conference Proceedings USLI XV 2000, pp. 589-593.

Chang, et al., "Interface Characteristics of Selective Tungsten on Silicon Using a New Pretreatment Technology for ULSI Application", 1997 IEEE, pp. 738-743.

Park et al., "Low Damage In Situ Contact Cleaning Method by a Highly Dense and Directional ECR Plasma," Jpn J. Appl. Phys. vol. 35 (1996), pp. 1097-1101.

Schravendijk et al., "Protective Layer to Enable Damage Free Gap Fill," Novellus Systems, Inc., U.S. Appl. No. 12/002,171, filed Dec. 14, 2007.

Schravendijk et al., "Protective Layer to Enable Damage Free Gap Fill," Novellus Systems, Inc., U.S. Appl. No. 60/925,255, filed Apr. 18, 2007.

Liu et al., "Methods for Etching High Aspect Ratio Structures," Novellus Systems, Inc., U.S. Appl. No. 60/962,638, filed Jul. 30, 2007.

Liu et al., "Methods of Removing Silicon Nitride and Other Materials During Fabrication of Contacts and Interconnects," Novellus Systems, Inc., U.S. Appl. No. 60/905,782, filed Mar. 7, 2007.

* cited by examiner

ADSORPTION BASED MATERIAL REMOVAL PROCESS

FIELD OF THE INVENTION

The present invention pertains to methods of removing layers of material on a substrate. The methods are particularly useful for accurate and conformal removal of atomic layers of oxide material such as silicon dioxide on a partially fabricated integrated circuit. As examples, the methods can be applied for pre-clean operations, for fabrication of gate dielectric in transistors, and for fabrication of memory and logic devices.

BACKGROUND OF THE INVENTION

Fabrication of integrated circuit (IC) devices at a modern level of miniaturization demands techniques that can operate at an atomic scale. Certain components of IC devices now have dimensions of tens or hundreds of Angstroms, corresponding to only a few atomic layers of material. For example, gate dielectric in modern IC transistors can have a thickness of only 12 Å, corresponding to only four atomic layers of silicon dioxide. It is often desirable to fine-tune the electronic properties of these components by altering their dimensions, which would involve deposition or removal of only a few atomic layers of material. While atomic layer deposition (ALD) and atomic-scale epitaxial growth techniques have been developed, the methods for controlled removal of one or several atomic layers are still limited.

Atomic layer etching technique (ALET) has been used for controlled etching of silicon and gallium arsenide. ALET involves chemisorption of a halogen, such as chlorine gas on the surface of silicon or GaAs, and subsequent removal of the reaction product through heat, laser or UV irradiation, or exposure to the argon ion beam. The amount of etched material is controlled by the self-limiting nature of chemisorption, and by the number of adsorption-desorption cycles applied to the substrate surface. This technique, although valuable for its purpose of semiconductor etching, is limited to the halogen—silicon chemistry and is not widely applicable. For instance, it cannot be applied to other materials of the IC device, such as silicon dioxide. Furthermore, sputtering during the desorption step is often damaging to the wafer components since it involves bombardment of the wafer surface with high-energy species.

Another specific example of atomic layer etching has been described by Yoder (U.S. Pat. No. 4,756,794). In this case nitrogen dioxide gas is adsorbed onto the surface of diamond (carbon), which is then irradiated by an ion beam. During irradiation $NO_2$ decomposes, and decomposition products oxidize carbon to easily removable gaseous carbon oxides. Again, controlled etching of atomic layer of diamond is achieved due to the self-limiting nature of $NO_2$ adsorption on the surface of the diamond. As in the case of silicon ALET, the described chemistry is not widely applicable. The method also necessarily involves irradiation with high-energy ions, which may be damaging to the wafer. None of the described above methods is applicable to etching of $SiO_2$ on an atomic scale.

Silicon dioxide and its carbon-doped variants are important dielectric materials used in IC devices. Silicon dioxide serves as a dielectric in bulk dielectric layers, as a gate dielectric in transistors, and as a capacitor dielectric in memory devices, such as DRAM. It also is inadvertently formed on the layers of silicon when the partially fabricated wafer is exposed to air. This type of silicon dioxide, known as native oxide, forms a thin film on the layer of silicon. Native oxide film together with oxide residue produced during etching and/or ashing frequently presents a problem for further processing steps. When formed in the bottom of a silicon landed via or contact hole, native oxide and other oxides are highly undesired, since they raise the overall electrical resistance of the via after it is filled with conductive materials. FIG. 1A shows a cross-sectional depiction of a partially fabricated integrated circuit having a via 101 residing in a bulk dielectric layer 103. The via 101 is landed in a silicon-containing transistor source 105. Other components of the transistor, a drain 107 and a gate 109 are also shown. Transistor components reside in the bulk layer of silicon 111. Native oxide film 113 is shown to cover the silicon-containing material in the bottom of the via.

Oxide material is conventionally removed in a pre-clean processing step. The resulting device with a pre-cleaned via is shown in FIG. 1B. A variety of methods can be employed for the pre-clean step, including plasma etching with reactive and/or inert species, dry chemical etching, and wet etching such as HF dip. It should be understood that since native oxide is readily formed when silicon is exposed to ambient air, it is highly desirable to conduct pre-clean step and subsequent via filling step in one apparatus taking care to avoid exposure to oxygen. The via is often filled with a conductive material by a CVD or ALD method and it is therefore highly desirable to conduct the pre-clean step in the deposition apparatus or at least in an apparatus provided in the same vacuum environment as the deposition apparatus. This requirement limits the number of practically feasible pre-clean methods to dry etching processes, which will be discussed further.

As indicated, in a step following the pre-clean, the via 101 is filled with conductive material 115. Referring to FIG. 1C, a cross-sectional depiction of the wafer shows the filled via after the deposition step. The via may be filled with such material as W, Cu, Ru, TiN or WN which can be deposited by a CVD or ALD step.

Several methods have been developed for silicon dioxide removal. It should be understood, that none of these methods can accomplish a well controlled removal of one or several atomic layers of silicon dioxide. All of the methods described below remove bulk amounts of silicon dioxide and are poorly controlled at an atomic level.

Most of silicon dioxide etching methods are relying on silicon dioxide—fluoride chemistry. It is convenient to use this chemistry because it is selective for silicon dioxide and does not affect elemental silicon, and because silicon fluoride products are either gaseous or easily sublimated compounds, and can therefore be easily removed after the etching is complete.

Hydrofluoric acid, HF, does not etch silicon dioxide when dry, but readily reacts with it in the presence of moisture or other catalysts following reactions 1 and 2.

$$6HF + SiO_2 \rightarrow H_2SiF_6 + 2H_2O \qquad (1)$$

$$H_2SiF_6 \rightarrow SiF_4\uparrow + 2HF\uparrow \qquad (2)$$

The resulting hexafluorosilicic acid, when not in solution, immediately dissociates into gaseous products, silicon tetrafluoride and hydrofluoric acid. Therefore the HF etch in the presence of small amounts of water is a viable method of silicon dioxide removal under essentially "dry etch" conditions. This method, however, is rarely used due to corrosive properties of $HF/H_2O$ mixtures, which may damage the process chamber. It is usually preferred to either generate HF in situ from precursors, or to employ a different fluoride source, such as ammonium fluoride ($NH_4F$) or ammonium bifluoride (NH$_4$F.HF). Both of these salts react with silicon dioxide according to reactions 3 and 4.

$$6NH_4F+SiO_2 \rightarrow (NH_4)_2SiF_6+2H_2O+4NH_3 \qquad (3)$$

$$3NH_4F.HF+SiO_2 \rightarrow (NH_4)_2SiF_6+2H_2O+NH_3 \qquad (4)$$

These reactions result in easily removable gaseous and liquid products and in a solid salt, ammonium hexafluorosilicate. This salt is readily decomposed into gaseous products when heated, in what is usually referred to as a sublimation step:

$$(NH_4)_2SiF_6 \rightarrow 2NH_3\uparrow + SiF_4\uparrow + 2HF\uparrow \qquad (5)$$

Ammonium fluoride and ammonium bifluoride cannot be easily introduced into the dry-etch chamber, due to their relatively low vapor pressure, and are most often formed from gaseous precursors within the chamber.

There is a wealth of literature describing deposition of etchants onto the wafer surface coated with oxide. All of these processes are essentially CVD-type processes, in which the reactant gases are introduced into the chamber simultaneously and react in the gas phase to form etchants. The etchants are formed in bulk in the process chamber and are then deposited onto the wafer surface. In most of these processes the amount of deposited etchants is controlled by the flow rate and flow time of the reactant gases, substrate temperature, or chamber pressure. The amount of etched material is subsequently determined from the amount of deposited etchants or from the time that etchants were allowed to react with the underlying layer. These CVD-type processes are not well suited to accurately control the thickness of a layer to be removed and cannot be applied for removal of defined amounts of material on an atomic scale. Although in some cases the amount of deposited etchant can be controlled by the use of microbalance, it is not possible to achieve accurate atomic layer control over material removal by these types of methods.

The precursors used for formation of fluoride etchants in these processes are usually simultaneously introduced into reaction chamber and are allowed to react to produce an etchant which may or may not be deposited onto the wafer surface. Thus an uncontrolled amount of etchant is brought into contact with the on the wafer surface. This etchant then reacts with native oxide layer by any of the reactions 1-5, and the resulting reaction products are removed either by purging or, if ammonium hexafluorosilicate is the product, by a separate sublimation step, followed by purging.

Nishino et al. (U.S. Pat. No. 5,030,319) describes several embodiments of these CVD-type etching methods, which differ in the nature of precursor gases and in the conditions of the processes. For example, the authors describe an embodiment in which NF$_3$ and NH$_3$ gases are reacted in a microwave discharge forming ammonium fluoride and ammonium bifluoride, which deposit onto the wafer and etch silicon dioxide according to reactions 3 and 4. In another example H$_2$O vapor and HF gas are introduced into the chamber to achieve the etching according to reaction 1. In yet another example, SF$_6$ and H$_2$O gases are introduced into the chamber as precursors. Following a microwave discharge, a solution of HF in sulfuric acid is formed, which is deposited onto the wafer surface, and etches silicon dioxide according to equation 1. Similar methods employing etchants produced by the plasma reaction of NH$_3$ and NF$_3$ were disclosed by Phan et al. in a communication at SEMICON (2006, pp. 157-163).

Jeng et al. (U.S. Pat. No. 5,282,925) describes an etching method in which NH$_3$ and HF gases are simultaneously and rapidly introduced into the reaction chamber and their reaction products are condensed onto the wafer. Since NH$_3$ is a base and HF is an acid they react immediately upon mixing, according to reactions 6 and 7. The etching occurs as discussed above.

$$NH_3+HF \rightarrow NH_4F \qquad (6)$$

$$NH_3+2HF \rightarrow NH_4F.HF \qquad (7)$$

The only control over the amount of etched material that is possible in this situation is the control over the substrate temperature, composition, and residence time of the reactant film.

In one embodiment, Jeng et al. describes silicon dioxide etching method which has some control over the amount of etched material and Jeng et al. speculate that the method could be used for removing monolayers of material. In this method condensed ammonium bifluoride is placed in a source container connected to the reaction chamber, which contains the substrate. The source container is maintained at a temperature which is lower than the temperature of the wafer substrate. By regulating the pressures and temperatures within the chamber and within the source container, it is conceivable to find conditions when the ammonium bifluoride vapor would form an adsorbed monolayer on the surface of the wafer, and would etch controlled amount of silicon dioxide. The amount of etching is monitored by a quartz crystal microbalance (QCM) coated with silicon dioxide. Although this proposed method may provide some fine control over the etching process, it is laborious and imprecise due to difficulties in QCM calibration.

The CVD-type etchant deposition processes are poorly controlled at an atomic level. These methods are also not well suited for etching relatively small amounts of material, particularly from the high aspect ratio features of the substrate. The bulk amount of etchant deposited onto the substrate surface in these methods usually forms a blanket film of low conformality and uniformity. While these methods sometimes work adequately in the substrates with low aspect ratio features, they do not provide highly conformal and uniform etchant film coverage needed for removal of material from high aspect ratio recesses.

Therefore there is a need for a reliable method for removal of defined amounts of material on an atomic scale with better uniformity and conformality.

SUMMARY

The invention may be used in processes for manufacturing integrated circuits such as in interconnect and contact pre-clean applications, gate dielectric processing, manufacturing of memory and logic devices, or any other applications where removal of one or several atomic layers of material is desired. The invention may also be used in other contexts such as in manufacturing displays or in any application involving controlled removal of thin layers of material from a substrate. In certain embodiments, the methods of this invention rely on a self-limiting nature of adsorption of at least one reactant on the substrate surface. In a preferred embodiment, a first reactant is introduced to the substrate in a first dosing step (a) to adsorb on the substrate until the surface is at least partially saturated. A second reactant is then added in a second dosing step (b), reacting with the adsorbed layer of the first reactant to form one or more etchant species. The amount of deposited etchant, and, consequently, the amount of etched material is limited by the amount of adsorbed first reactant. By repeating at least steps (a) and (b), controlled atomic-scale etching of material can be achieved.

The process flow described above may also include steps that remove excess or unreacted chemicals (usually called purging steps) performed after at least one of the dosing steps. The materials to be removed in the purging steps can be in the gas phase or on the surface of the substrate. In cases when the by-products are not gaseous materials and therefore cannot be easily removed by purging, a separate sublimation step may be added to the general process flow. In a sublimation step the by-products are driven off the substrate by applying energy (e.g., thermal, mechanical, or radiative energy) to the substrate. For example, they can be removed by heating, applying UV, e-beam, ions and the like.

The present invention can be practiced in many different kinds of an apparatus, which allow sequential dosing of reactants into the process chamber housing the substrate. These may include CVD and ALD-type systems, as well as other types of deposition chambers (e.g., the Novellus System Concept 2 and Concept 3 Altus chambers).

The process conditions may vary depending on the steps performed, on the nature of the reactants and the substrate, and on the particular chemistry of the process.

In some embodiments, the chamber wall of a chamber housing the substrate is maintained at a temperature of between about 50 and 150° C. and the substrate is maintained at a temperature of not greater than about 70° C. during at least the dosing steps. The whole process can be performed under a pressure of about 5 milliTorr-10 Torr.

The process conditions and the process flow may be controlled by a controller unit which comprises program instructions for a monitoring, maintaining and/or adjusting certain process variables, such as reactant introduction timing, gas flow rate, temperature, pressure and the like.

In certain embodiments, the methods of this invention can be practiced in a multi-station apparatus, where the dosing and sublimation steps are performed in one chamber having several stations. In one embodiment, one or more of the stations is dedicated to the dosing steps. The dosing stations may comprise a wafer pedestal, which can heat or cool the wafer to a predetermined temperature. For example the pedestal can maintain the wafer at a temperature of less than about 70° C. The reactants can be sequentially introduced into the dosing station chamber through a showerhead, connected to the gas distribution manifold. The reactants can also be generated in a separate chamber containing the source of plasma and can be directed into the dosing chamber through a distribution manifold. One or more of the stations of this apparatus can be dedicated to sublimation steps. Sublimation of by-product can be carried out in sublimation stations which, in certain embodiments, are capable of heating the wafer to a temperature at least about 50° C. In another embodiment, the invention can be practiced in a non-sequential process chamber such as batch reactor that holds multiple wafers processed together or in a single station reactor for processing one wafer. In non-sequential process chambers, the entire dosing and/or sublimation steps may be performed on stationary wafers.

In a preferred embodiment, the process flow of the invention is used for controlled removal of oxide materials from a semiconductor surface by a halide etchant. In a first step (a) the substrate is exposed to the first reactant which forms a partially or fully saturated layer on an exposed surface of the oxide. In the next step (b), the substrate is exposed to a second reactant, whereby the first and second components combine to produce a halide etchant in an amount limited by the saturated layer. Steps (a)-(b) may be repeated until a layer of the halide etchant is formed in an amount sufficient to etch a layer of oxide by a specified thickness. By repeating these cycles, substrate material can be controllably etched to a desired depth, e.g., up to about 160 Å.

The oxide material to be removed, such as silicon oxide or germanium oxide material, can be etched from many different features including a silicon contact, an active silicon contact, a germanium contact, a SiGe contact, a silicide contact, or a polysilicon contact.

A variety of halide etchants, such as chloride and fluoride etchants, may be used for removal of oxide material. For example, HF and $NH_3$ may be used as reactants which react to form ammonium fluoride and ammonium bifluoride etchants.

In another example HF and $H_2O$ are sequentially introduced in the dosing steps (a) and (b) to form an etching mixture.

The reactants can be derived from either direct or indirect sources. For example, HF may be generated by mixing $H_2$ with atomic or molecular fluorine produced by a plasma discharge in a mixture of $NF_3$ and, e.g., argon gases. Atomic or molecular fluorine can also be generated by subjecting a perfluorocarbon to a plasma discharge. $NH_3$ can be generated by a plasma discharge in a mixture of $N_2$ and $H_2$ gases. Plasma excitation can be accomplished using various plasma sources, including DC, RF, and microwave, whether provided directly in the process chamber or remotely. In other embodiments, thermal cracking, irradiation with optical sources or catalyzed or uncatalyzed chemical reactions can be employed to produce the reactants from indirect sources. In a separate embodiment of the invention the method of etching an oxide from a semiconductor substrate comprises contacting the substrate with a first component to form a saturated layer of the first component on an exposed surface of the oxide in a step (a); and then contacting the substrate with a second component in a step (b), whereby one of the first and second components catalyzes etching of the oxide by the other component. The reactant and the catalyst are then allowed to etch the oxide material. For example, one component may comprise HF, and the catalyst component may comprise $H_2O$ which facilitates the etching of oxide material by HF.

These and other features and advantages of the invention will be described in more detail below with reference to the associated drawings.

DETAILED DESCRIPTION OF A PREFERRED EMBODIMENT

Aspects of the present invention are directed to atomic layer removal (ALR™) of materials from substrates, such as partially fabricated integrated circuits. While the methods of present invention find particular use in the processing of semiconductor substrates, they can also be employed in other applications, such as removal of oxide material from other workpieces such as those employed in flat panel display manufacturing. ALR™ methods achieve accurate and conformal removal of material on small scales not feasible with prior techniques, e.g. on scales of about 160 Å or smaller. In fact, they can be employed when removal of layers of only several angstroms or tens of angstroms is desired. Atomic layer removal methods allow control of the depth of etching by repeating deposition of etchant cycles, where each cycle may remove as little as only a monolayer or submonolayer of material. These methods can be performed in a CVD-type apparatus, and can be easily integrated with existing wafer manufacturing processes.

Figure 1A:
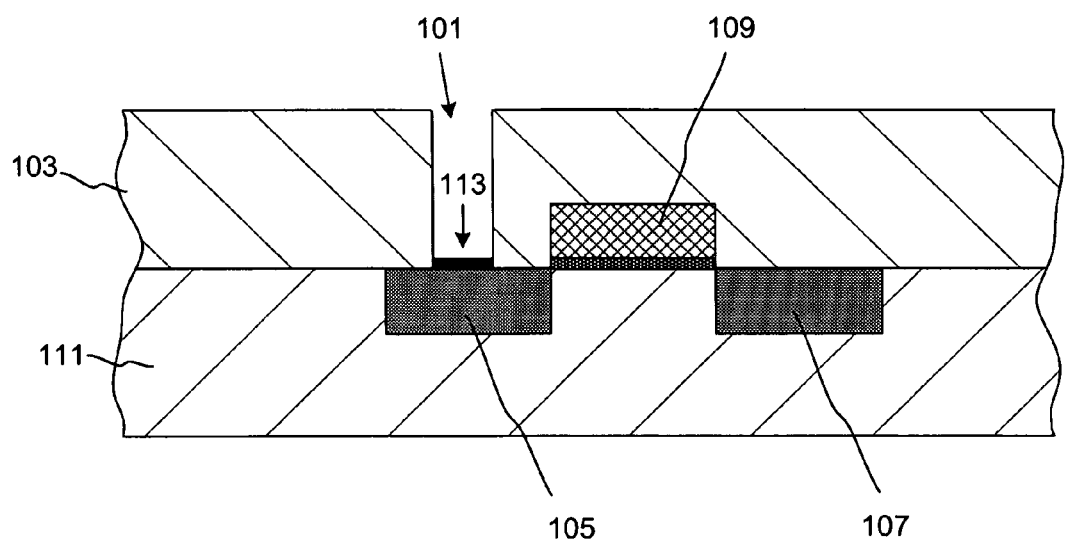
FIGS. 1A-1C show cross sectional depictions of device structures created by pre-clean and deposition steps during interconnect fabrication.
Figure 1B:
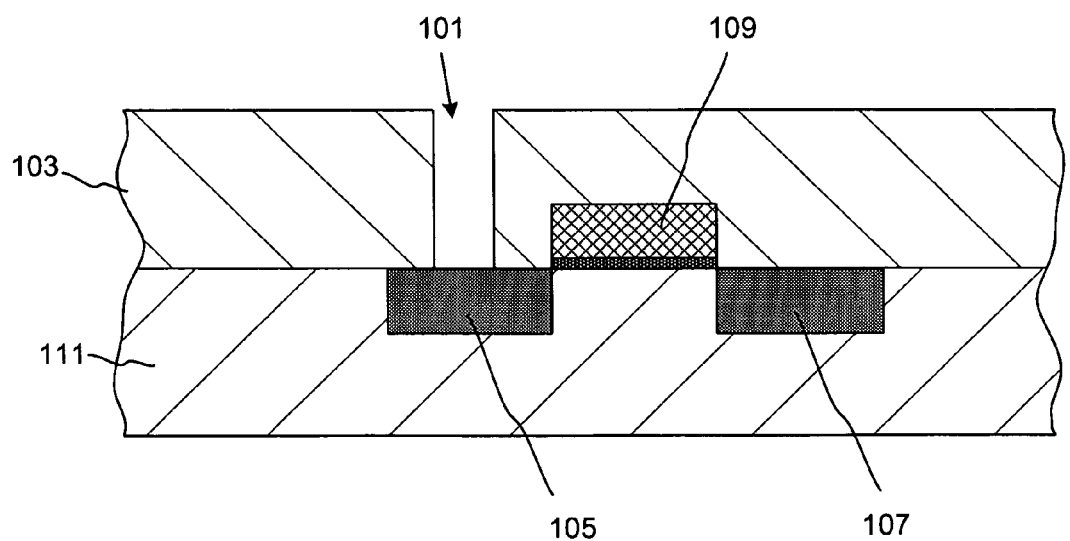
Figure 1C:
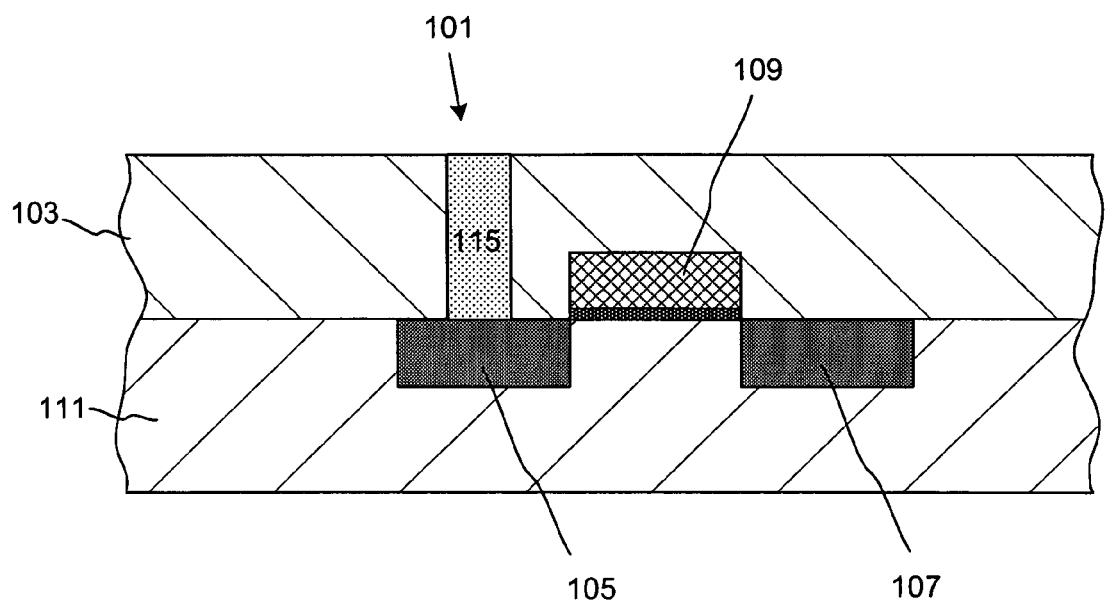

The applications of atomic layer removal methods include but are not limited to pre-clean operations, gate dielectric fabrication, and processing of capacitor dielectric in memory devices, such as DRAMs and flash memory devices. The atomic layer removal pre-clean of interconnects may involve removal of silicon oxide from silicon, active silicon, polysilicon, and silicide contacts. Silicide contacts comprise metal silicides, such as nickel and cobalt silicides, ternary silicides, such as platinum nickel silicides and other silicide materials, commonly used in interconnects. Active silicon contacts refer to electrically active contacts typically formed with electrically active doped silicon material, and may be distinguished from electrically inactive silicon contacts, such as those used in mechanical structures on MEMS devices. The methods of present invention can be used for removal of material from both electrically active and electrically inactive silicon contacts. Atomic layer removal pre-clean methods may also be employed for removal of germanium and silicon oxides from germanium and silicon germanium contacts. A typical interconnect which can be subjected to atomic layer removal pre-clean step is shown in FIG. 1A. In this case a via 101 is landed into silicon containing transistor source 105. Other interconnect configurations, such as a via landed into the silicon containing drain, or into the polysilicon containing gate may also be envisioned but are not shown for clarity reasons. The term "via" in the context of present invention is intended to include so called "contact holes" for connecting the first metallization layer with the base silicon layer as well as the vertical interconnects between adjacent metallization layers, which are conventionally referred to as vias. As was described in the background section, the bottom of the via 101 is covered with native oxide 113 as well as other oxide residues in some cases, which are removed during pre-clean step resulting in a structure shown in FIG. 1B. The cleaned via can now undergo further processing such as tungsten nitride or tungsten deposition, which leads to the structure shown in FIG. 1C.

There are several advantages that result from employing atomic layer removal method for the pre-clean step. First, material removal can be performed in essentially dry-etch mode and can be integrated in one vacuum environment with the CVD step, avoiding queue time problems and regrowth of native oxide common for wet-etch pre-clean. Secondly, atomic layer removal methods allow controlled removal of oxides produced during etch as well as the native oxide film from the interconnect surface. The methods of present invention also allow highly conformal and uniform deposition of the etchant into the recesses of the substrate, such as vias and contact holes. Atomic layer removal methods are especially advantageous for pre-clean treatment of substrates with small dimension and high-aspect ratio features. Recesses of aspect ratios of greater than about 3:1, greater than about 20:1, greater than about 30:1 and even greater than about 50:1 can be successfully pre-cleaned using the methods provided by present invention. Often such features will have a width of less than about 100 nm (or even less than 50 nm in some cases). It should be realized that due to poor control and low conformality of etchant deposition in CVD-type etching techniques, it is not possible to effectively clean high aspect ratio vias and contacts by these methods. For example, in the pre-clean of contact holes connected to the source, the drain, and the gate components of a transistor structure, CVD-type etching methods will lead to over-etching of the gate contact hole and insufficient material removal from the source and the drain contacts. These undesired etching differences stem from the lack of conformality in high-aspect ratio feature deposition, which is shared by all CVD-type processes. More etchant is deposited into the higher-lying and lower aspect ratio gate contact hole than into the source and drain vias, resulting in removal of larger amount of material from the gate contact. The atomic layer removal method of the present invention is based on surface adsorption of reactants, and is therefore a highly conformal method. The amount of etchant deposited by atomic layer removal method does not vary significantly across the surface of the substrate and is not highly dependent on the dimensions, aspect ratios, or positions of the features on the wafer.

Applications of the atomic layer removal method are not limited to pre-clean of the transistor contacts, and may be extended to pre-cleans of other types of interconnects for which etching of one or several atomic layers of material is desired. Removal of oxides from interconnects in the pre-clean step reduces the resistance of conductive pathway and leads to faster and more reliable IC devices.

Figure 2:
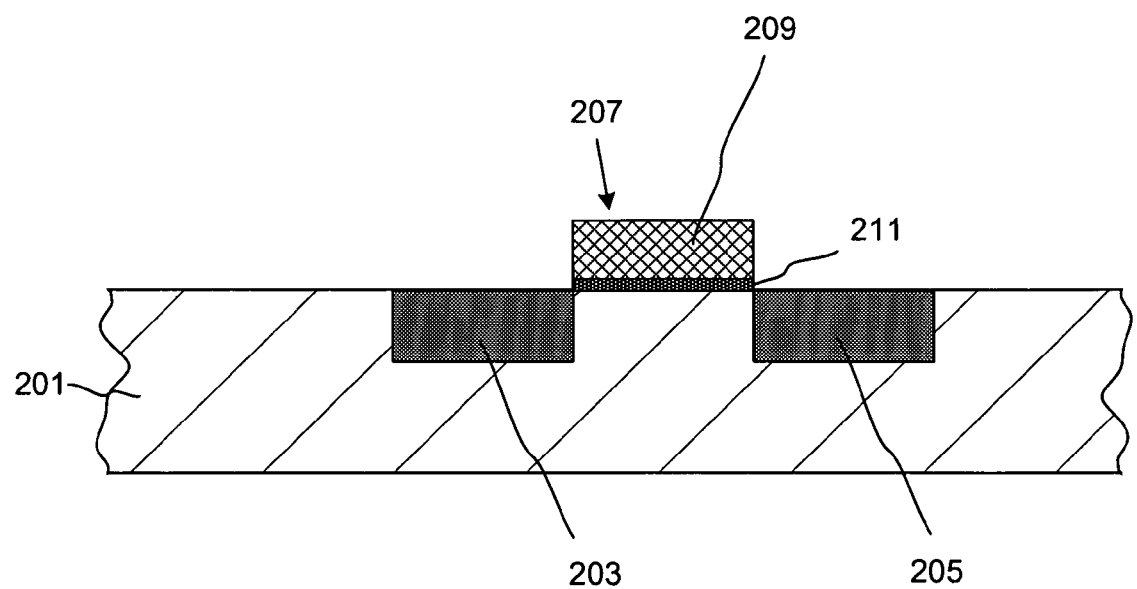
FIG. 2 shows a cross sectional depiction of a transistor structure, illustrating the gate dielectric component.

The methods of atomic layer removal are versatile and may be adapted to etching of a number of materials. The methods may be used for removal of different types of silicon dioxide, such as native silicon dioxide and manufactured thermal silicon dioxide, a type of $SiO_2$ which is usually deposited by CVD from tetraethylorthosilicate (TEOS). Other types of silicon dioxide, such as silicon oxide formed on substrate surface during plasma etching, or RIE treatment can also be removed by atomic layer removal methods. Low-k dielectric materials, such as carbon doped silicon dioxide, hydrogenated silicon oxycarbides (SiCOH), and fluorine doped silicon dioxide, can be etched by ALR™ as well. These methods can also be used for removal of silicates. In certain embodiments, material removal may be applied to etching of metal oxides, such as aluminum, tantalum and hafnium oxides used as gate dielectrics. In other embodiments atomic layer removal methods may be used for atomically controlled etching of conductive materials, such as tungsten, aluminum, and copper. As mentioned, atomic layer removal can be employed in the processing of gate dielectric layers. Referring to FIG. 2, an exemplary n-type transistor is shown. The transistor resides in a layer of p-type silicon 201 and consists of three components, a source 203, a drain 205, and a gate 207. The source and the drain are composed of n-type silicon, and the gate comprises two layers, a top electrode layer 209 and a bottom dielectric layer 211. The electrode 207 is usually composed of polysilicon, and a dielectric layer is typically composed of thermal silicon dioxide, or, more recently, high-k dielectric materials, such as hafnium silicates and hafnium silicon oxynitrides. When positive potential is applied to the gate, electrons in the p-silicon are attracted to the area under the gate, forming an electron channel between the source and the drain. The transistor device relies on the gate dielectric layer for providing capacitance between the gate electrode 209 and the p-type silicon layer 201. Ultimately, the capacitance of the dielectric layer determines the amount of current between the source and the drain, and, consequently, the overall transistor performance. Capacitance of a dielectric layer 211 can be increased by reducing its thickness or by employing dielectric materials with high dielectric constant. In modern devices, the gate dielectric layer has been miniaturized to a thickness of only 12 Å of silicon dioxide and to about 30 Å of a high-k dielectric. In both cases, this thickness corresponds to only several atomic layers of material. It is often desirable to fine-tune the capacitance of gate dielectric by decreasing its thickness. The atomic layer removal process provides the necessary methods for etching controlled amount of material from the gate dielectric layer before the gate electrode layer is deposited. These methods are unique in that they provide atomic-scale control over etching, and may be applied to the components as thin as 10-100 Å. Atomic layer removal can be easily integrated into the gate manufacturing process and promises to be a valuable tool for tuning electronic properties of IC device components. Embodiments of the present invention allow extremely careful control of gate dielectric thickness by selectively removing excess deposited gate dielectric material using the etching techniques described herein.

Figure 3:
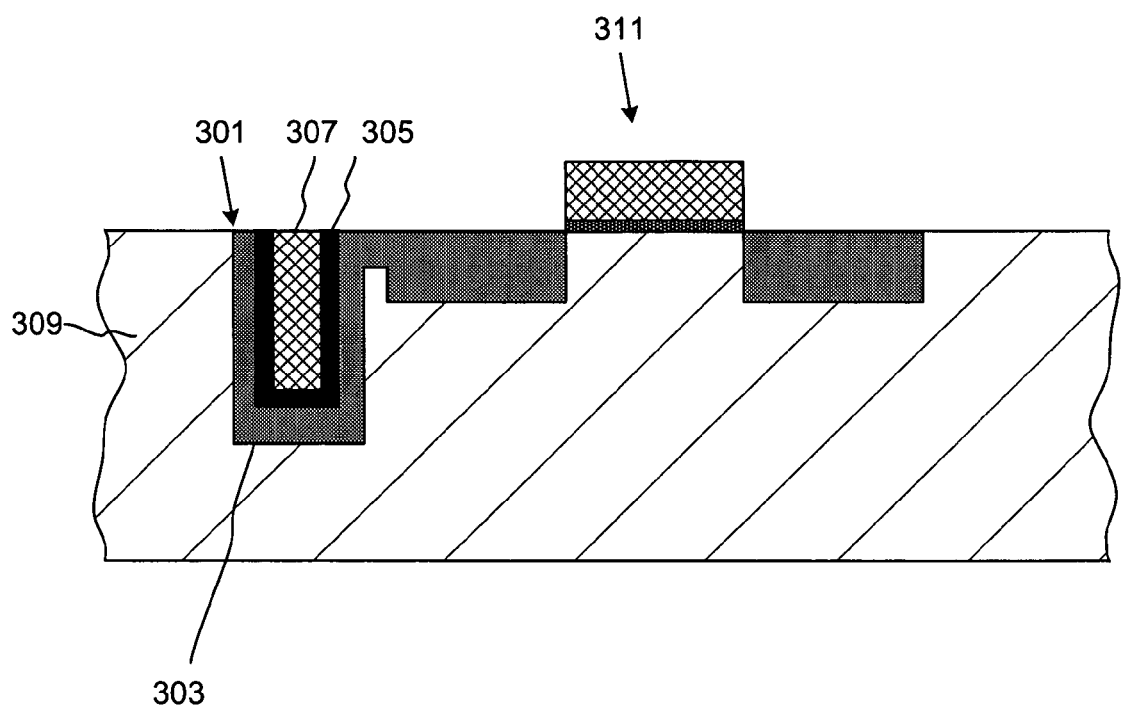
FIG. 3 shows a cross-sectional depiction of memory unit structure illustrating the capacitor dielectric component.

Another possible application of atomic layer removal is the etching of controlled amounts of capacitor dielectric material in a memory device, such as a DRAM. Memory devices involve arrays of millions of capacitors, each storing one bit of information. One exemplary DRAM unit is illustrated in FIG. 3. The capacitor 301, consisting of n-type silicon layer 303, a dielectric layer 305, and a polysilicon layer 307, is embedded into the bulk layer of silicon 309, and is connected to the transistor structure 311. The electric signal from the transistor is transmitted to the capacitor and is stored as a one bit memory unit. Capacitance of this unit is dependent on the thickness of capacitor's dielectric layer, and it is highly desirable to be able to control this thickness not only by deposition but also by etching processes. Atomic layer removal methods are ideally suited for this purpose, since they can provide controlled atomic-scale etching for a variety of dielectric materials used in the DRAMs such as silicon, tantalum, zirconium and niobium oxides, silicon nitride, and the like. Atomic layer removal can be used in memory device manufacturing for adjustment of capacitor dielectric thickness before deposition of polysilicon electrode 307.

Figure 4:
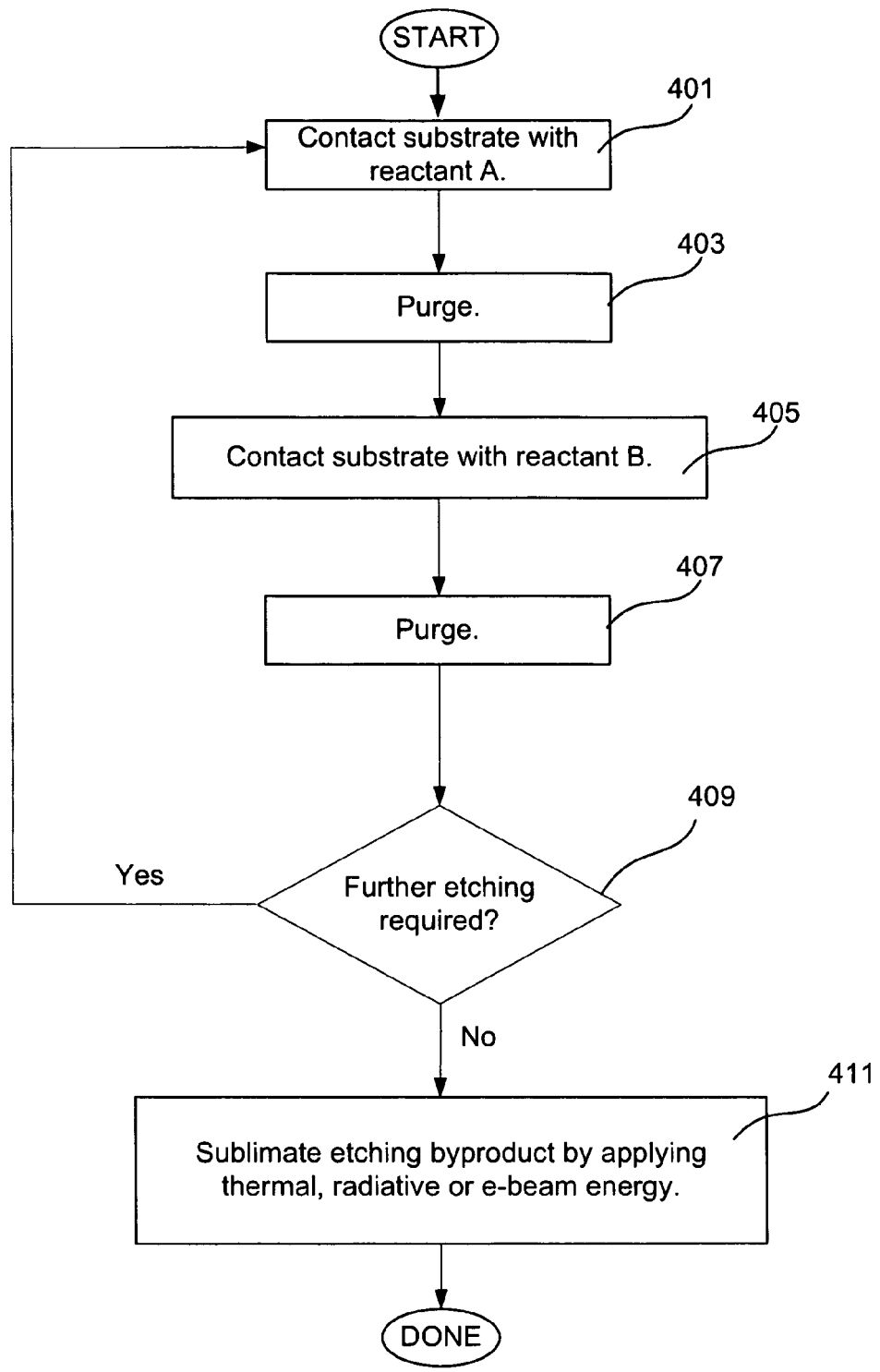
FIG. 4 presents a possible process flow diagram for a method of removing atomic layers of material on a partially fabricated integrated circuit.

A preferred embodiment of this invention can be illustrated by an exemplary process flow diagram shown in FIG. 4. The semiconductor substrate is contacted with a first reactant A in a first step 401. This step and other steps where reactants are introduced are known as dosing steps. The first reactant is adsorbed onto the substrate surface in a self-limiting manner, forming a saturated layer on the exposed surface of material. Preferably, although not necessarily, the first reactant should not chemically react with any of the components of the wafer. After admission of the first reactant, the process chamber may be purged in a step 403 until the first component is substantially or entirely removed, except for the saturated layer adsorbed on the substrate surface. In a next dosing step 405, a second reactant B is introduced into the chamber and is brought into contact with the substrate. Again, reactant B alone preferably should not be chemically reactive towards the wafer components, but should react with the first reactant A to form an etchant. When the second reactant B contacts the adsorbed layer of the first reactant A, A and B react and form an etchant in the amount limited by the amount of reactant in the adsorbed layer. Depending on the reaction rate and individual adsorption properties of the material, the second reactant may first be adsorbed to the substrate surface before reacting with the layer of the first reactant A, or it may react with the layer of A without being itself substantially adsorbed, or a combination of these two mechanisms may occur. Alternatively, in some cases, reactant B may deposit in excess. Regardless of the amount of B deposited and the mechanism by which B deposits, the reaction between A and B will be limited by the amount of A which was initially resident on the substrate surface. After the etchant is formed by reaction between A and B, it is allowed to etch the material of the substrate. A purging step 407, removing the excess of reactant B and/or reaction by-products, may be performed as necessary at any time after step 405 is complete. Any suitable method for removal of volatile material can be used in step 407. This step may encompass flowing large amounts of inert gas through the chamber (purging) or evacuating the chamber by applying vacuum (pumping).

As indicated, the amount of etchant formed in the reaction between A and B is limited by the amount of adsorbed reactant A in the saturated layer. This, in turn, limits the amount of etched material to one or several atomic layers. Since the amount of etched material per cycle of steps 401-407 can be easily calibrated, it is possible to estimate the number of cycles to be performed for a required amount of etching. Various endpoint detection techniques as known in the art (e.g., various optical and/or electrical endpoint detection techniques) may also be employed to determine whether enough etching has taken place. As shown in a decision step 409, if further etching is required, the steps 401-407 are repeated. If the etching is complete, the by-products of the etching reaction are sublimated by applying thermal, radiative or e-beam energy. The sublimation step may also be used to remove the by-products of etchant-forming reactions. See step 411. The net result of this process is the removal of atomic layers of material from a semiconductor substrate. It is to be understood, that the diagram, shown in FIG. 4, is for illustration purposes only and does not limit the atomic layer removal process to this particular sequence of steps. For example, purging steps 403 and 407 may not be necessary in certain processes, or may be substituted with pumping steps, and the sublimation step 411 may not be required if the reaction by-products can be removed by other means. Other steps may be added to the general process flow as necessary.

In some embodiments the process flow described in FIG. 4 may be modified by an additional decision step after the sublimation of by-products is performed. For example, one or several etchant deposition cycles may be performed according to the process flow described in FIG. 4. After the etchant is deposited to a desired thickness, a sublimation of by-products can be performed. Then, if further etching is desired, the whole procedure can be repeated, starting with one or several cycles of etchant deposition and following with a sublimation step. These procedures can be repeated until a desired amount of material is removed. Such a procedure will be especially advantageous in removing material from small-dimension high-aspect ratio recesses. By sequentially performing cycles of etchant deposition and by-product sublimation, it is possible to etch more material from the high aspect ratio via, than allowed by the maximum amount of etchant which can physically fit into the via. Performing sublimation after a certain number of steps, vacates the via and provides the necessary space for further deposition of an etchant. This embodiment can be illustrated by an example, in which a via is completely or nearly completely filled by etching by-products after four cycles of etchant deposition. If further removal of material is desired from this via, the by-products are sublimated, and an additional amount of etchant is deposited into the vacated via by performing a required number of etchant deposition cycles. If this number is greater than 4, then additional sublimation step is performed after the etchant deposition, and the procedure can be repeated until a required amount of material is removed from the via.

In some embodiments, the chamber wall of a chamber housing the semiconductor substrate is maintained at a temperature of between about 50 and 150° C. and the semiconductor substrate is maintained at a temperature of not greater than about 70° C. during at least the dosing steps. The whole process can be performed under a pressure of 5 miliTorr-10 Torr.

Figure 5:
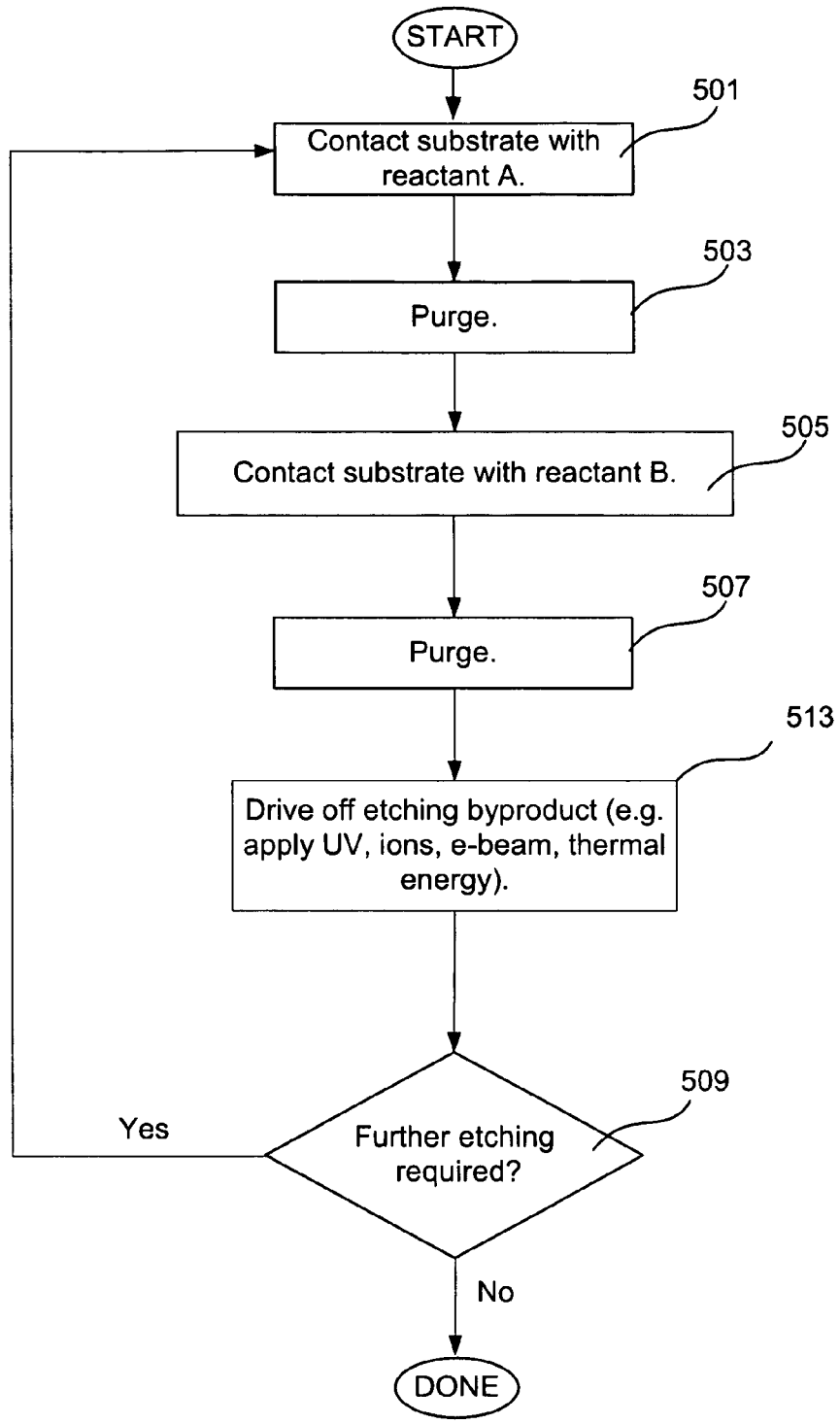
FIG. 5 presents another possible process flow diagram for a method of removing atomic layers of material on a partially fabricated integrated circuit.

In another embodiment of the present invention, the ALR™ process follows the steps of the flow diagram shown in FIG. 5. In this case, operations 501-507 are analogous to the operations 401-407, illustrated in FIG. 4. However, in this process flow, the etching by-product is removed in step 509 by applying thermal, radiative or e-beam energy after each cycle of etchant formation. Each time after the etching by-product is driven off, it is decided in step 511, whether the etching should be performed further. If further etching is required, the sequence of steps 501-513 is repeated; if not, the process is complete. The process flow diagram shown in FIG. 5 serves as an example and does not limit the atomic layer removal process to the described steps. Other steps may be added as necessary, and purging or pumping steps may be considered optional in some embodiments. In some embodiments of the present invention, the process is performed according to the process flows described in FIG. 4 and FIG. 5, but the deposition of at least one reactant is not entirely surface-controlled. For example, one of the reactants may be adsorbing on the surface of the substrate while also undergoing partial decomposition. In other embodiments, the reactant is deposited without decomposition but in a very controlled manner such that a carefully limited amount of bulk phase reactant is deposited on the surface to be etched. For example, reactant may be deposited to a thickness of about 100 Angstroms or less.

The process in these embodiments is not controlled by the formation of the saturated layer. In this type of the process, the amount of deposited reactant can be limited by the amount of time the reactant spends in contact with the substrate and/or by adjusting the partial pressure of the reactant in the chamber. Examples of materials which can spontaneously decompose on the substrate surface include diborane and tetrakis (dimethylamino)hafnium. The relative amount of decomposition can be sometimes reduced by decreasing the temperature of the substrate. However, in some cases the etchant formation reaction may necessarily require the use of temperatures and pressures, which inadvertently cause partial reactant decomposition.

Thus as explained here, embodiments of the present invention encompass processes relying on forming an etchant on the substrate surface by sequential addition of reactants to the substrate, even in the cases when the reactant deposition is not entirely adsorption controlled. They also encompass such processes in which the second deposited reactant is forming additional amounts of etchant by combining with one of the etching by-products. For example, referring to equations 3-4, water is formed as a by-product of etching of silicon dioxide by ammonium fluoride and ammonium bifluoride. When $NH_3$ is added as a first reactant and HF is added as a second reactant to the substrate undergoing material removal, HF will not only react with the ammonia, but will also form an $HF/H_2O$ etchant. In this case the material removal is not strictly limited by the saturated layer of $NH_3$ formed on the surface of the substrate. Control of the amount of deposited etchant can be achieved in this case by adjusting the reactant exposure time, the partial pressure of the reactants or other process conditions. Alternatively, care should be taken to remove or substantially remove water before the HF dosing step, thereby regaining adsorption-limited regime of etchant deposition.

The reactants used in the atomic layer removal process may be directly introduced into the process chamber, either alone or in mixtures with other materials, such as inert carrier gases like argon and nitrogen. The reactants may also be generated during the atomic layer removal process from indirect sources. For instance, HF reactant may be generated by mixing $H_2$ with atomic or molecular fluorine produced from $NF_3$ by subjecting $NF_3$ to a plasma discharge. When $NF_3$ is subjected to plasma discharge atomic nitrogen and fluorine are formed. Nitrogen atoms recombine fast to form a dinitrogen molecule, while the fluorine atoms, which are partially recombined into difluorine gas are reacted with subsequently introduced $H_2$ gas. This type of two-step HF generation may avoid formation of ammonium fluoride and bifluoride etchants in the gas phase, which would inadvertently form if a mixture of $H_2$ and $NF_3$ were subjected to a plasma discharge. $NH_3$ reactant can be formed by plasma reactions between $H_2$ and $N_2$ precursor gases. In general, the reactants can be generated from precursors by a variety of means which comprise catalyzed or uncatalyzed chemical reactions, applying plasma discharge, irradiation with UV, e-beam, etc. Plasma excitation can be performed by generating plasma either remotely or internally with a variety of plasma sources, including DC, RF and microwave sources. Thermal cracking of precursors can also be employed for generation of reactants. In both of the processes illustrated in FIGS. 4 and 5, the amount of etched material is limited by the amount of adsorbed reactants in the saturated layer on the substrate surface, and can be controlled by adjusting the number of cycles in which the etchant is formed. Atomic layer removal methods differ from the CVD-type etchant deposition methods in that they are based on separate surface-controlled reactions. In ALR™, the reactants are directed alternately over a substrate surface, separated by purging steps using an inert gas or other method. In atomic layer removal the reactant, which is preferably gaseous at the conditions of the process, is adsorbed to the substrate surface to form a saturated layer. The thickness of this saturated layer depends on the nature of the substrate and the reactants, as well as on the conditions of the process, such as pressure and temperature. It is to be understood that saturated adsorbed layer is thermodynamically different from bulk layers of material deposited by condensation, and those skilled in the art will know how to determine the conditions for deposition of adsorbed layer without depositing the bulk amounts of material. The adsorbed saturated layer is not necessarily a monolayer of material, and depending on the thermodynamics of the interactions between the substrate and the adsorbed material, the "saturated layer" may be a fractional layer, a monolayer, a bilayer, a trilayer, etc. The "saturated layer" is thermodynamically distinct from the condensed bulk layer even when the "saturated layer" comprises several atomic monolayers, in that it includes only the molecules attracted to the surface by chemical or physical adsorption surface forces. It should also be understood, that the "saturated layer" as that term is used herein embodies cases in which not all of the vacant adsorption sites of the substrate are occupied by the deposited material, and is not limited in meaning to the saturation of the substrate by excess of adsorbed material such as saturation defined by Langmuir isotherm.

The amount of material etched during one cycle of ALR™ process may vary depending on the nature of the substrate and adsorbed reactants, but is estimated to be between about 1-7 Å. Specifically, an etching depth of about 2 Å has been observed in the case of deposition of HF and $NH_3$ reactants on $SiO_2$ surface after one cycle These numbers represent an average amount of etched material, and in the cases when submonolayers are etched, the average etched depth may be smaller than the dimensions of the etched molecule. The relationship between the amount of etched material and the thickness of deposited layer can be experimentally calibrated. For example, when HF and $NH_3$ reactants were used, it was experimentally determined that the ratio between the thickness of deposited fluoride etchant and the depth of etched silicon dioxide is approximately 3:1. This means that one cycle of atomic layer removal with these reactants deposits about 6 Å of etchant, which removes about 2 Å of silicon dioxide. Thirty cycles of atomic layer removal with these reactants will remove 60 Å of silicon dioxide. The described method is unique in that it offers atomic scale control over etching. The desired depth of etching can be achieved by applying a certain number of etching cycles. This number can be calculated for desired amounts of material removal for particular processes from experimentally calibrated etch rate per cycle values. It should be noted that when atomic layer removal is practiced in accordance with the process flow illustrated in FIG. 4, where the etching byproduct is not removed after each etchant deposition cycle, the layer of accumulated byproduct will eventually interfere with the diffusion of the etchant to the wafer material and will reduce the effectiveness of the etch. It has been shown that, in certain embodiments, this method can achieve etching depth of at most about 160 Å, preferably about 50 Å, and more preferably about 20 Å. The process flow shown in FIG. 5 in which the reaction by-product is removed after each cycle of etchant formation, in principle, allows unlimited depth of material etching which is achieved by repeating the cycles. In practice, the preferred depth of etching may be the same as discussed above for the first process flow, since repeating the cycles for an etch depth of more than 160 Å is time and effort consuming.

In a preferred embodiment of this invention, the etchant which is formed on the substrate surface from the two reactants, is a halide etchant. Halide etchants include but are not limited to acids, such as hydrogen halides like HF, HCl, and HI; salts with a variety of cations and compositions, such as $NH_4F$, $NH_4F.HF$, $(CH_3)NH_3F$, $NH_4Cl$; and other covalent or ionic compounds in which the halogen is in a formal oxidation state of $-1$, like $NF_3$. Fluoride is generally the preferred halide etchant when etching silicon dioxide or a related material such as a carbon doped silicon oxide or a germanium-silicon oxide.

In one example, the substrate wafer containing exposed areas of silicon dioxide, is contacted with gaseous $NH_3$ which adsorbs on the wafer surface. After the process chamber is purged to remove $NH_3$, gaseous HF is introduced and contacts the substrate having the adsorbed layer of $NH_3$. The order in which the reactants are introduced to the substrate surface is not always important and may be reversed, depending on the process needs. After both of the reactants have been sequentially delivered to the substrate surface, the neutralization reaction occurs on the surface, and a layer of ammonium fluoride and bifluoride is formed according to the reactions 6 and 7. These salts are allowed to etch silicon dioxide according to reactions 3 and 4. The gaseous by-products of the reaction are removed by purging, and it is thereafter determined whether further etching of $SiO_2$ is needed. If the etching is not complete, a second cycle of $NH_3$ dose followed by an HF dose is performed. These cycles can be repeated as many times as necessary to remove the desired amount of $SiO_2$. When etching is complete, the solid ammonium hexafluorosilicate by-product is removed in a separate sublimation step by heating the substrate to at least about 50° C., more preferably to between about 80 and 150° C. and even more preferably to between about 90 and 10° C.

In the above example, the etchant is formed by a neutralization reaction between basic and acidic reactants. Acid-base neutralization is a fast and reliable method for formation of etching salts, and is a very well suited reaction for the ALR™ process. A variety of acids and bases can be used for etchant formation in the material removal process. Halogen-containing acids, and bases like ammonia, amines, hydrazine are particularly preferred.

(For example, the basic and acidic reactants sequentially introduced to the substrate surface can be gaseous $NH_3$ and HCl. Ammonium chloride etchant is formed on the surface according to reaction 8

$$NH_3+HCl \rightarrow NH_4Cl \tag{8}$$

This etchant may be used for etching materials which react with it to form easily removable products. For example $Al_2O_3$ can be etched by ammonium chloride according to reaction 9; and the reaction by-product can be removed by sublimation according to reaction 10.

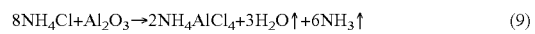
$$8NH_4Cl+Al_2O_3 \rightarrow 2NH_4AlCl_4+3H_2O\uparrow+6NH_3\uparrow \tag{9}$$

$$NH_4AlCl_4 \rightarrow NH_3\uparrow+AlCl_3\uparrow+HCl\uparrow \tag{10}$$

The present invention is not limited to the chemistry described in these specific examples. One skilled in the art will understand how to use the described atomic layer removal process flow to produce etchants for a variety of wafer materials, adapting known chemistry to the conditions of the process. For example, acidic etchants may be produced from sequentially introduced adsorbed reactants, and may be employed for etching of metal oxides, such as oxides of tantalum, hafnium, zirconium and the like. The etchant chemistry can also be adapted for etching of metals, such as tungsten, copper and aluminum. Those skilled in the art will understand how to form known metal or metal oxide etchants under ALR™ conditions.

In another embodiment of the present invention one of the reactants A and B is a catalyst for etching of the substrate material by the other reactant. This can be illustrated by an example, when dry HF is first adsorbed on the $SiO_2$-containing substrate surface. No etching is occurring in the absence of the catalyst. When $H_2O$ or alcohol catalyst is introduced and contacts the substrate, HF is activated and etches silicon dioxide in the amount limited by the amount of HF in the saturated layer. It is also possible to introduce the catalyst in the first step and follow by contacting the substrate with the reactant.

Atomic Layer Removal Apparatus

The methods of the invention may be carried out in any number of process chambers. Examples of currently available commercial chambers include the Novellus Systems Concept 2 Altus chamber, the Novellus Concept 3 Altus processing chamber (Novellus Systems Inc., San Jose, Calif.), and any of a variety of other commercially available CVD or ALD tools. In some cases, the reactor contains multiple stations in which parallel reactions can take place. See, e.g., U.S. Pat. No. 6,143,082, which is incorporated herein by reference for all purposes.

Figure 6:
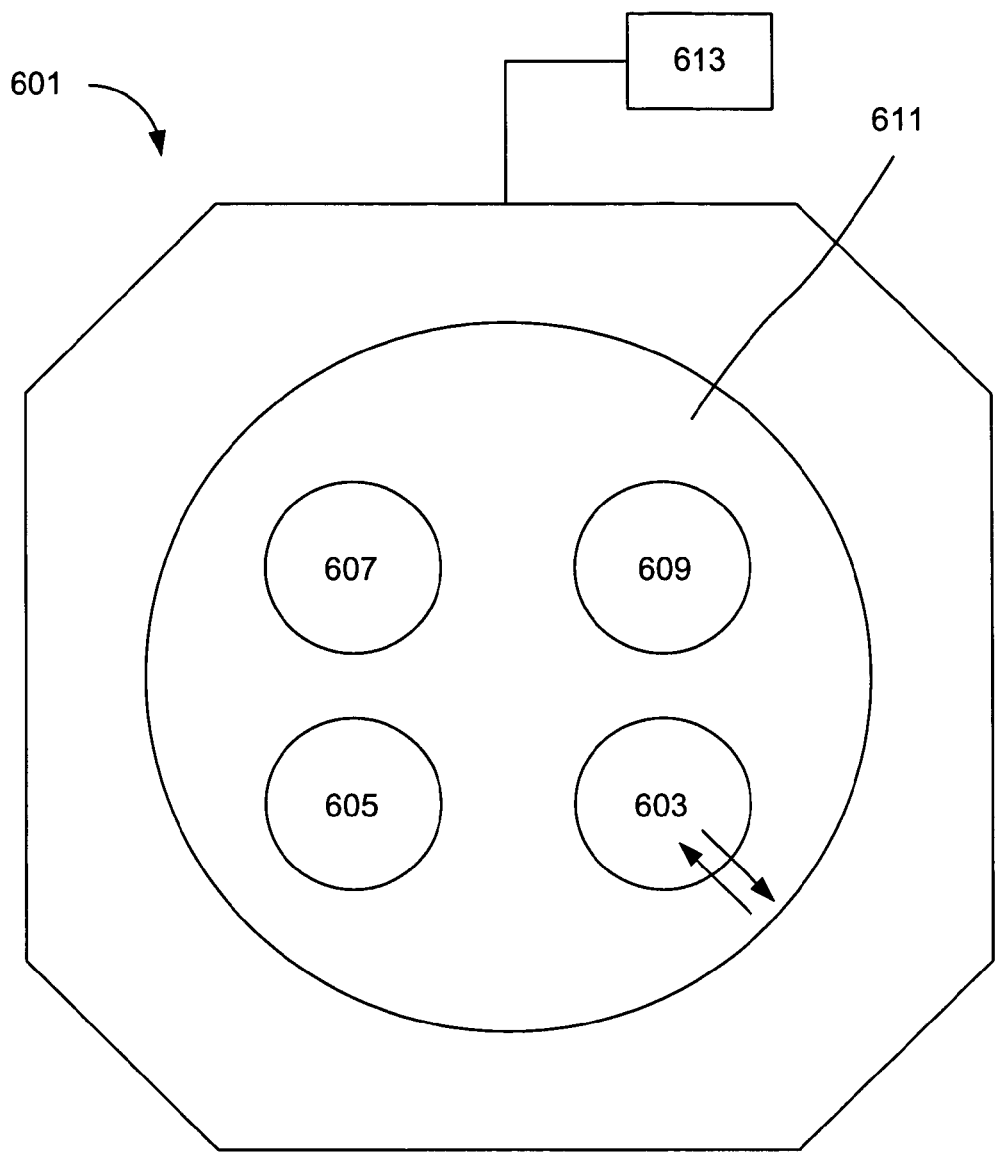
FIG. 6 is a top view schematic representation of a multi-station apparatus suitable for practicing the current invention.

In a preferred embodiment a multi-station apparatus specifically designed for atomic layer removal process is used. The multi-station reactor allows one to run different processes concurrently in one chamber environment, thereby increasing the efficiency of wafer processing. An example of such an apparatus is depicted in FIG. 6. A schematic presentation of top view is shown. An apparatus chamber 601 comprises four stations 603-609. In general, any number of stations, each capable of having a localized atmosphere isolated from adjacent stations, is possible within the single chamber of a multi-station apparatus. Station 603 is used for loading and unloading of the substrate wafers. Stations 603-609 may have the same or different functions. For example, some of the stations may be devoted to deposition step, in which the dosing of reactants occurs, while other stations may be used only for sublimation of a by-product. Alternatively, all of the stations may be used for deposition, and sublimation may be carried out in a different chamber.

A plurality of variations of multi-station configurations may be used. For example, deposition may be carried out at stations 603-607, and sublimation at station 609. In another embodiment, sublimation occurs at stations 607 and 609, and deposition at stations 603 and 605. In yet another embodiment, sublimation occurs at station 603, and deposition occurs at stations 605-609.

In a preferred embodiment, stations 605 and 607 are deposition stations, and stations 603 and 609 are sublimation stations. An indexing plate 611 is used to lift the substrates off the pedestals and to accurately position the substrates at the next processing station. After the wafer substrate is loaded at station 603, it is indexed to station 605, where deposition of reactants occurs. The wafer is then moved to station 607 where further deposition cycles are performed and the etching reaction is completed. The substrate is further indexed to station 609, where the etching by-product, such as ammonium hexafluorosilicate is sublimated, by, for example, subjecting the substrate to the temperature of at least about 50° C. Additional sublimation is performed when the substrate is moved to station 603, completing the material removal process. The processed wafer is unloaded at station 603, and the module is charged with a new wafer. During normal operation, a separate substrate occupies each station and each time the process is repeated the substrates are moved to new stations. Thus, an apparatus having two deposition stations, 605 and 607, and two sublimation stations 609 and 603, allows simultaneous processing of four wafers. Alternatively, four wafers may be subjected to identical steps at all four stations, without dedicating certain stations to deposition and sublimation processes.

The process conditions and the process flow itself can be controlled by a controller unit 613 which comprises program instructions for a monitoring, maintaining and/or adjusting certain process variables, such as reactant introduction timing, gas flow rate, temperature, pressure and the like. The controller may comprise different or identical instructions for different apparatus stations, thus allowing the apparatus stations to operate either independently or synchronously. The controller may comprise instructions for sequential introduction of the first and second reactants to form an etchant and for allowing an etchant to etch the material. The instructions can also allow performing a desired number of etchant deposition cycles, by repeating the deposition of reactants as many times as necessary. The instructions for the purging steps performed after introduction of at least one of the reactants can also be included.

The controller can control both the temperature of the substrate and of the process chamber. For example, it may comprise program instructions for maintaining a chamber wall of a chamber housing the semiconductor substrate at a temperature of between about 50 and 150° C. and maintaining the semiconductor substrate at a temperature of not greater than about 70° C., preferably at about 20-50° C. during the reactant deposition steps. The controller may also comprise instructions for applying energy to the semiconductor substrate to drive off the byproduct produced during the etching step. Thus, for example, the controller may comprise instructions for heating the wafer to a temperature of at least about 50° C.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and sublimation processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the atomic layer removal apparatus.

The system software may be designed or configured in many different ways. For example, various chamber component subroutines or control objects may be written to control operation of the chamber components necessary to carry out the inventive etching processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma control program may include code for setting RF power levels applied to the process electrodes at the target and the wafer chuck.

Examples of chamber sensors that may be monitored during reactant deposition and/or sublimation include mass flow controllers, pressure sensors such as manometers, and thermocouples located in pedestal or chuck. Appropriately programmed feedback and control algorithms may be used with data from these sensors to maintain desired process conditions.

Each station of an apparatus depicted in FIG. 6 is independent in terms of its function, temperature, or gas flow. Each station 603-609 includes its own wafer pedestal and a showerhead located above the pedestal. Showerheads are used to flow gases over substrates located on the pedestals. The gases are introduced to the showerhead through a gas distribution manifold described in detail below.

Figure 7:
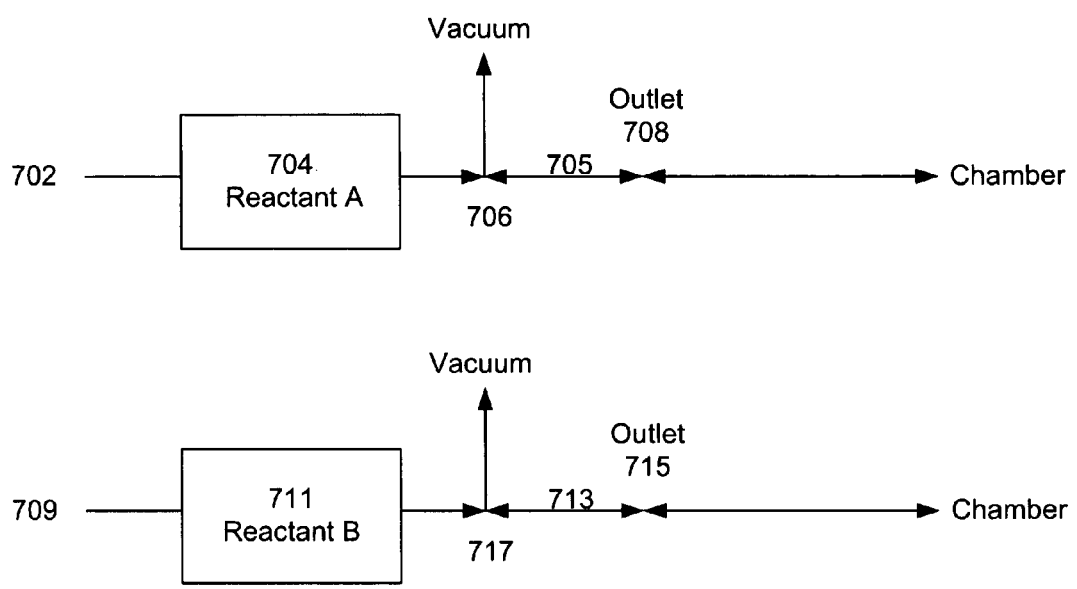
FIG. 7 is a schematic representation of a manifold system which can be used for delivery of reactants in the apparatus of present invention.

The gas manifold system, which provides line charges to the various gas distribution lines is shown schematically in FIG. 7. Manifold 704 has an input 702 from a source of reactant gas A. Manifold 711 has an input 709 from a source of reactant gas B. The manifolds, 704 and 711 provide the reactant gases to the deposition chamber through valved distribution lines, 705 and 713 respectively. The various valves are opened or closed to provide a line charge, i.e., to pressurize the distribution lines. For example, to pressurize distribution line 705, valve 706 is closed to vacuum and valve 708 is closed. After a suitable increment of time, valve 708 is opened (valve 715 is closed) and the reactant gas A is delivered to the chamber. After a suitable time for delivery of the gas, valve 708 is closed. The chamber can then be purged to a vacuum by opening of valve 706 to vacuum.

Similar processes are used to deliver the reactant gas B. To introduce the reactant gas B, distribution line 713 is charged by closing valve 715 and closing valve 717 to vacuum. Opening of valve 715 allows for delivery of the reducing gas to the chamber. It has been found that the amount of time allowed for line charges changes the amount and timing of the initial delivery of the gas.

FIG. 7 also shows vacuum pumps in which valves 706 and 717 respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

Note that the deposition processes described above may require precise timing of valves and mass flow controllers (MFCs) supplying doses of reagent to the semiconductor substrate during the deposition of reagents. In one way to make this possible, valve and MFC commands are delivered to embedded digital input-output controllers (IOC) in discrete packets of information containing instructions for all time-critical commands for all or a part of an ALR™ deposition sequence. The C2 and C3 Altus systems of Novellus Systems, Inc. provide at least one IOC sequence. The IOCs can be physically located at various points in the apparatus; e.g., within the process module or on a stand-alone power rack standing some distance away from the process module. There are typically multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. In certain embodiments, multiple IOC sequences may run at any given time. An IOC translates the information in a packetized sequence and delivers digital or analog command signals directly to MFC or pneumatic solenoid banks controlling the valves. This implementation reduces delays in command execution at the valve or MFC to as little as 5 ms. Typical control systems in which commands are issued one by one to the IOC are subject to communication delays between the computer controlling module operation and the IOC. Delays in the single-command implementation can exceed 250 ms.

In one example, to achieve good response and repeatability, the reactant gas A flow may be introduced by first enabling flow through a first reagent Mass Flow Controller (MFC) and diverting the flow to a process vacuum pump to stabilize flow before introducing the agent into the deposition chamber. To stabilize the flow of precursor gas A, the outlet valve 708 is closed while divert valve 706 is open. The manifold system then pressurizes delivery line 705 to assure a controlled initial burst of precursor gas A by closing the divert valve 706 with the process outlet valve 308 closed for between about 0.10 and 3.00 seconds. Next, the system opens the outlet valve 708 to the deposition chamber with the divert valve closed to deliver precursor gas A to the process chamber during deposition. Preferably, all valve timing is controlled using an embedded input-output controller command sequence as described above. An analogous diverting process may be applied to the second reagent in the manifold 711. This type of gas delivery system is described in further detail in U.S. patent application Ser. No. 11/349,035, which is incorporated herein by reference for all purposes.

Figure 8:
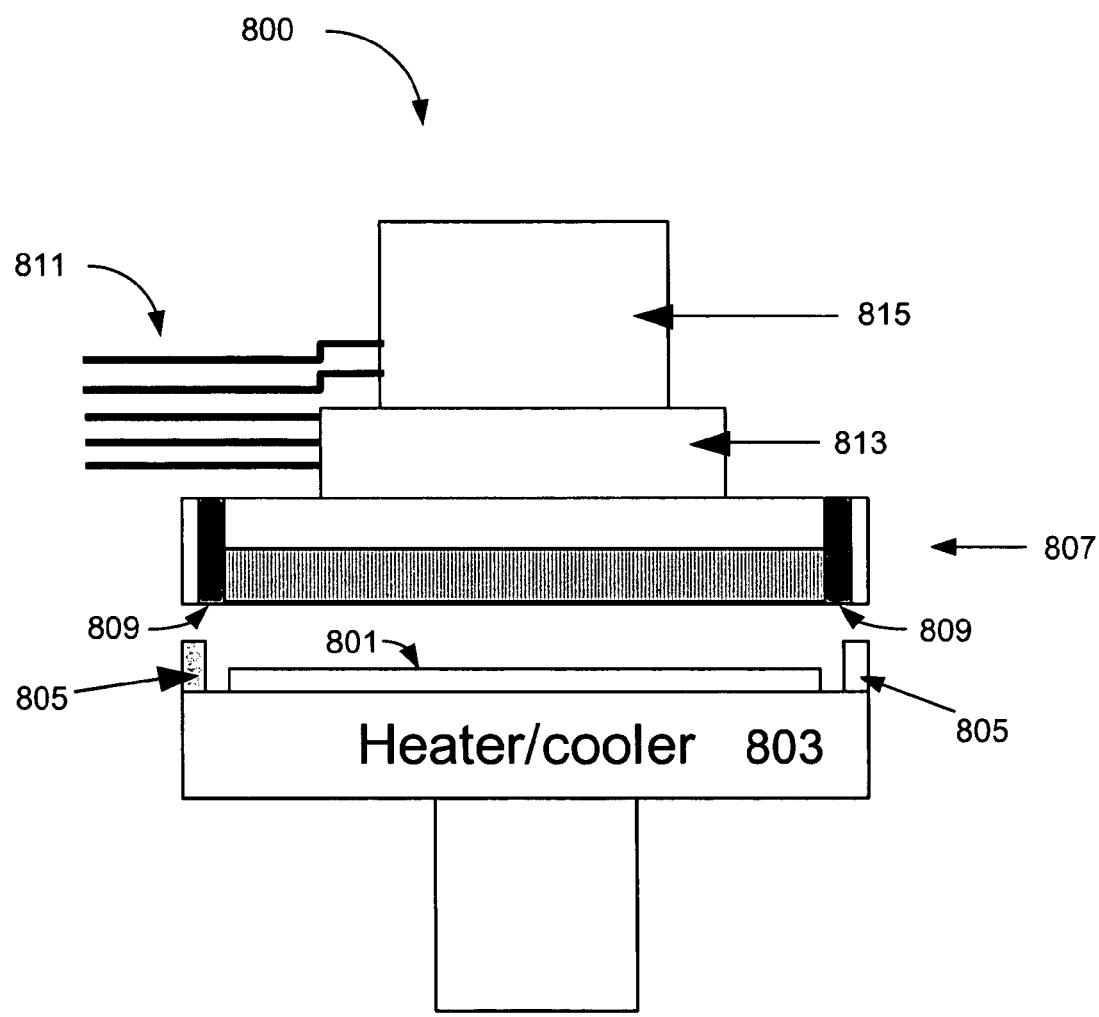
FIG. 8 is a cross-sectional side view of a deposition station suitable for performing dosing steps of the atomic layer removal process.

This type of gas distribution manifold is especially useful in deposition stations, but may also be used for distribution of gases, such as inert gases in the sublimation stations. A schematic representation of a typical deposition station 800 is shown in FIG. 8. A cross-sectional side view is presented. A substrate (e.g., a wafer 801) is positioned on a moveable wafer holding pedestal 803, capable of heating or cooling the wafer to a predetermined temperature. Station seal 805 is located around the perimeter of the pedestal, and is used to seal the volume between the wafer 801 and a showerhead 807. The seal prevents the cross-talk between the stations, and allows to maintain separate process conditions in each station. In an alternative embodiment the stations can be isolated by flowing curtains of inert gas, such as argon, in a manner that allows to maintain distinct process environment within individual stations. The station depicted in FIG. 8 is not sealed. The station is sealed when the wafer-holding pedestal 803 is moved up to contact the showerhead 807 with the seal 805. Internal pumping port 809 is embedded into the showerhead and is used to maintain the desired pressure and to regulate the gas flow during the dosing steps. It is also used to pump out the gases during the purging steps. Each station has its own independent pressure controlling unit which regulates the work of each pumping port. The reactive and inert gases are supplied by the gas lines 811 to the gas distribution manifold 813, and are then controllably introduced into the sealed reaction chamber through the showerhead 807. If precursor gases such as $NF_3$ and $H_2$ are used as an indirect source of reactants, the precursors can be first introduced into the chamber 815, which contains the plasma source. In this chamber the reactants are formed from precursor gases by a plasma discharge, and are then introduced into the gas distribution manifold 813 and are subsequently directed to the wafer 801 through the showerhead 807.

Figure 9:
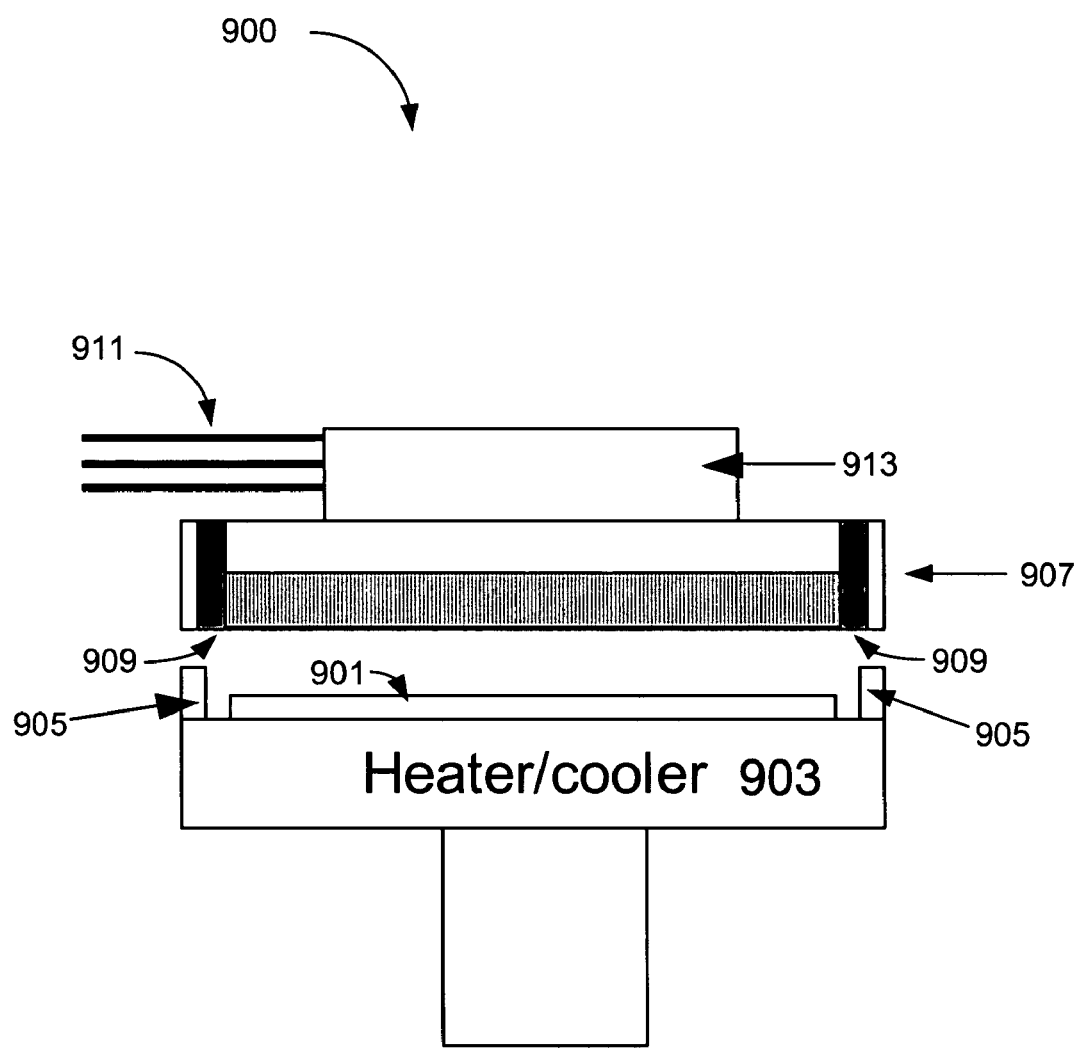
FIG. 9 is a cross-sectional side view of a sublimation station suitable for driving off the etching by-product in the atomic layer removal process.

A typical sublimation station 900 is shown in FIG. 9. The key elements of the sublimation station are analogous to the elements of the deposition station and comprise a wafer 901, a moveable heater/cooler pedestal 903, capable of heating the wafer to a pre-determined temperature of at least about 50° C., a station seal 905, a showerhead 907, a pumping port 909, a gas distribution manifold 913 which uses the gases supplied by the gas lines 911. In the sublimation stations no reactive gases, such as HF and $NH_3$ are introduced, and the corresponding gas lines and a plasma source chamber are not needed.

High efficiency can be achieved by conducting atomic layer removal process in multi-station apparatus. However, this process can also be performed conventionally in a one-station chamber. For example, a single wafer or a batch of wafers (e.g. 20 or 50 wafers) can be processed within one chamber. In some embodiments both the dosing and the sublimation steps are performed in one chamber. In other embodiments the wafers are transferred to a different chamber for sublimation after the dosing steps have been performed. Both single-station and multi-station modules can be used as part of a vacuum integrated cluster tool, which allows to carry out several conceptually different wafer processing steps in one air-free environment. The invention is in no way limited to the exemplary apparatus described above. Atomic layer removal can be carried out in any type of an apparatus allowing sequential deposition of reactants onto the substrate surface.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of removing a layer of oxide from a substrate surface, the method comprising:
    (a) exposing a surface of the layer of oxide to dry hydrogen fluoride and allowing the dry hydrogen fluoride to deposit on the layer of oxide until the surface of the layer is partially or fully saturated with the hydrogen fluoride, wherein the dry hydrogen fluoride does not etch the material onto which it is deposited;
    (b) exposing the substrate to ammonia, whereby hydrogen fluoride and ammonia combine to produce a fluoride etchant in an amount limited by the amount of adsorbed dry hydrogen fluoride in (a);
    (c) repeating (a) and (b) until a layer of the fluoride etchant is formed in an amount sufficient to etch the underlying oxide by a specified thickness; and
    (d) applying energy to the substrate to drive off one or more etching by-products of an etching reaction between the fluoride etchant and the oxide.

2. The method of claim 1, wherein the fluoride etchant deposited during a single cycle of operation (a) and operation (b) removes a layer of silicon oxide having a thickness of about 1 Å to 7 Å.

3. The method of claim 1, wherein the layer of fluoride etchant etches the oxide to a depth of up to about 160 Angstroms.

4. The method of claim 1, wherein the layer of fluoride etches the oxide to a depth of at most about 50 angstroms.

5. The method of claim 1, wherein the layer of fluoride etches the oxide to a depth of at most about 20 angstroms.

6. The method of claim 1, wherein the oxide etched by the layer of fluoride exists on one or more of a silicon contact, an active silicon contact, a silicide contact, a polysilicon contact, an active germanium contact, an active silicon-germanium contact, a germanium contact, and a silicon-germanium contact.

7. The method of claim 1, wherein the substrate is maintained at the temperature of not greater than about 70° C. during operations (a) through (c).

8. The method of claim 1, wherein at least operations (a) through (c) are performed under a pressure of between about 5 milliTorr and 10 Torr.

9. The method of claim 1, wherein at least one of the dry hydrogen fluoride and ammonia is generated from an indirect source.

10. The method of claim 1, further comprising generating the dry HF from hydrogen and $NF_3$ or a perfluorocarbon.

11. The method of claim 1, further comprising generating the $NH_3$ from $H_2$ and $N_2$ gases.

12. The method of claim 1, wherein the dry HF and the $NH_3$ are generated with the assistance of a plasma source, an optical source, or a catalyst.

13. The method of claim 1, wherein the substrate is a partially manufactured integrated circuit.

14. The method of claim 13, wherein the layer of oxide comprises oxide on a contact or metal line within a contact hole or via of the partially manufactured integrated circuit.

15. The method of claim 1, wherein (a) comprises exposing a surface of the layer of oxide to dry hydrogen fluoride and allowing the dry hydrogen fluoride to deposit on the surface of the layer to a thickness of no more than about 100 Angstroms.

16. The method of claim 15, wherein the substrate is a partially manufactured integrated circuit.

17. The method of claim 16, wherein the layer of material comprises oxide on a contact or metal line within a contact hole or via of the partially manufactured integrated circuit.

18. The method of claim 1, further comprising:
    after applying energy to the substrate to drive off one or more byproducts produced during an etch operation, repeating operations (a), (b), (c), and (d) at least once to remove a desired amount of material.

19. The method of claim 1, wherein the method comprises forming a solid reaction by-product, said by-product being removed in (d) by sublimation.

20. The method of claim 1, wherein the method comprises removing less than about 160 Å of oxide in the presence of a bulk amount of the oxide.

21. The method of claim 1, wherein the fluoride etchant is ammonium fluoride or ammonium bifluoride.

22. The method of claim 1, wherein exposing the substrate to dry hydrogen fluoride comprises flowing dry gaseous hydrogen fluoride into a process chamber.

23. The method of claim 22, wherein at least one of the reactions occurring at a substrate surface generates moisture on said surface.

24. The method of claim 23, further comprising removing the moisture from the substrate surface before at least one operation of flowing dry hydrogen fluoride into the process chamber.

25. The method of claim 1, wherein operations (a) through (d) are performed in one chamber having one station.

26. The method of claim 1, wherein operations (a) through (c) are performed in one chamber and operation (d) is performed in a second chamber.

27. The method of claim 1, wherein at least operations (a) through (c) are performed in a batch process chamber.

28. The method of claim 1, wherein operations (a) through (d) are performed in one chamber having multiple stations.

29. The method of claim 1, wherein operations (a) and (b) are performed in one or more stations at a wafer temperature of not greater than about 70° C., and wherein operation (d) is performed at one or more different stations from the stations used to perform operations (a) and (b), and wherein the one or more stations used to perform operation (d) heat the wafer to a temperature of at least about 50° C.

30. The method of claim 1 further comprising purging or evacuating a chamber housing the substrate after at least one of the steps (a) and (b).

* * * * *